(12) United States Patent
Danzilio (10) Patent No.: US 6,307,221 B1
(45) Date of Patent: Oct. 23, 2001

(54) IN$_X$GA$_{1-X}$P ETCH STOP LAYER FOR DOUBLE RECESS PSEUDOMORPHIC HIGH ELECTRON MOBILITY TRANSISTOR STRUCTURES

(75) Inventor: David Danzilio, Hudson, MA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/195,478

(22) Filed: Nov. 18, 1998

(51) Int. Cl.[7] .............. H01L 31/072; H01L 31/109; H01L 31/0328; H01L 31/0336
(52) U.S. Cl. .............. 257/192; 257/194; 257/195; 438/167; 438/168; 438/169; 438/576
(58) Field of Search .................... 257/192, 194, 257/195; 438/576, 167, 168, 169

(56) References Cited

U.S. PATENT DOCUMENTS

| | | | |
|---|---|---|---|
| 4,742,379 | 5/1988 | Yamashita et al. | 357/22 |
| 4,792,832 | 12/1988 | Baba et al. | 357/16 |
| 5,021,857 | 6/1991 | Suehiro | 357/42 |
| 5,041,393 | 8/1991 | Ahrens et al. | 437/58 |
| 5,060,030 * | 10/1991 | Hoke | 357/22 |
| 5,091,759 * | 2/1992 | Shih et al. | 357/22 |
| 5,140,386 * | 8/1992 | Huang et al. | 357/22 |
| 5,196,359 | 3/1993 | Shih et al. | 437/40 |
| 5,270,228 | 12/1993 | Ishikawa | 437/39 |
| 5,272,109 | 12/1993 | Motoda | 437/129 |
| 5,285,087 | 2/1994 | Narita et al. | 257/192 |
| 5,324,682 | 6/1994 | Tserng | 437/56 |
| 5,330,932 | 7/1994 | Liu et al. | 437/133 |
| 5,364,816 | 11/1994 | Boos et al. | 437/133 |
| 5,372,675 | 12/1994 | Wakabayashi et al. | 156/649 |
| 5,504,353 * | 4/1996 | Kuzuhara | 257/194 |
| 5,514,605 | 5/1996 | Asai et al. | 437/40 |
| 5,521,404 | 5/1996 | Kikkawa et al. | 257/194 |
| 5,550,388 | 8/1996 | Haruyama | 257/24 |
| 5,641,977 * | 6/1997 | Kanamori | 257/192 |
| 5,760,427 | 6/1998 | Onda | 257/194 |
| 5,770,525 | 6/1998 | Kamiyama | 438/745 |
| 5,811,844 | 9/1998 | Kuo et al. | 257/194 |
| 5,900,653 | 5/1999 | Suzuki et al. | 257/194 |
| 6,060,402 | 5/2000 | Hanson | 438/745 |

* cited by examiner

Primary Examiner—William Mintel (57) ABSTRACT

The invention is a Pseudomorphic transistor structure having a semiconductor layer having a 2DEG layer therein, a Schottky layer, a transition layer and an ohmic contact layer on the transition layer, wherein a double recess structure is disposed through the ohmic layer onto the transition layer in which one or two layers of In$_y$Ga$_{1-y}$P are used as etch-stop layers to define the depth of the recess.

20 Claims, 6 Drawing Sheets

$In_xGa_{1-x}P$ ETCH STOP LAYER FOR DOUBLE RECESS PSEUDOMORPHIC HIGH ELECTRON MOBILITY TRANSISTOR STRUCTURES

FIELD OF THE INVENTION

The present invention relates to single and double etch-stop layers for a double recess PHEMT. The present application is related to U.S. Patent application Ser. No. 09/193,907, filed Nov. 18, 1998, to Danzilio, the disclosure of which is incorporated by reference.

BACKGROUND OF THE INVENTION

The use of hyper-abrupt heterojunctions, on the order of as few as one atomic diameter, has enabled advanced heterostructure devices to be realized. One of the more advantageous structures is the high electron mobility transistor(HEMT) structure. A particular class of these devices is the Pseudomorphic HEMT, or PHEMT device. These are higher performance devices than their counterpart the MESFET. The PHEMT structure has higher gain than the MESFET, and this results in power devices with higher efficiency and thereby higher power capabilities which has particular ramifications in the cellular phone business which is ever seeking lower DC voltage levels for operation. Another desirable attribute of PHEMTs is a relatively fast on/off cycle. In the "on" state, due to the high conductivity of the channel, there is low signal loss through the device. In the "off" state, the combination of lower pinch-off voltage and higher breakdown voltage translates to more truly "off" behavior with reduced signal leakage between terminals. The transition from on to off of the PHEMT is relatively quick, particularly when compared to the MESFET counterpart. The basic Pseudomorphic HEMT structure uses a high purity/high mobility InGaAs material that is not intentionally doped for carrier transport. Doping introduces scattering centers, which reduce carrier mobility and velocity as is well known to one of ordinary skill in the art. At equilibrium, the heterojunction between the wide band gap material and the narrow band gap (undoped/high mobility) material creates a quantum well in the narrow bandgap semiconductor material. Electrons from the high band gap material tunnel through the energy barrier in the higher bandgap material into the quantum well. This charge transfer forms a sheet of electrons, known commonly as a two dimensional electron gas (2DEG). These 2DEG electrons in the undoped narrow band gap material possesses a very high mobility and velocity.

Conventional HEMTs rely on the hyperabrupt heterojunction between AlGaAs and GaAs. As stated, such a structure lends itself quite well to the fabrication of high electron mobility transistors which make use of the 2DEG electrons in the GaAs channel. Another material which has come into prominence in 2DEG devices is InGaAs. The heterojunction between InGaAs and AlGaAs also forms the two dimensional electron gas by virtue of the quantum well formed between the narrow band gap InGaAs and the wide band gap AlGaAs. InGaAs is also a material which when undoped has a very high electron mobility. The electron mobility and peak electron velocity of InGaAs is in fact much higher than GaAs. Due to differences in lattice constants of the two materials, epitaxial growth of thin InGaAs layers on GaAs substrates results in considerable strain in the InGaAs layer. This strain further deepens the quantum well formed increasing the number of electrons in the 2DEG of the Pseudomorphic HEMT, as is well known to one of ordinary skill in the art. Lattice mismatch between GaAs and InGaAs increases with Indium concentration and hence deepens the quantum well. Lattice mismatch is desirable to a degree, however if indium is introduced in too high a concentration, InGaAs lattice relaxation can occur. The lattice relaxation is the state when accumulated strain is too great and is relieved through the formation of lattice defects which behave as scattering centers. These scattering centers have a deleterious effect on carrier mobility. It has been found that molar fractions of indium to gallium of 53 to 47 are desirable. That is, $In_{0.53}Ga_{0.47}As$ results in the material with a very high peak electron velocity, a relatively deep quantum well with more carriers disposed therein. However, due to severe lattice mismatch, an epitaxial structure containing $In_{0.53}Ga_{0.47}As$ can only be grown on an indium phosphide substrate and device fabrication of InP based materials is relatively immature compared to GaAs. The mole fraction of indium is preferably 15–25% when InGaAs is grown on a GaAs substrate; beyond this lattice relaxation can occur thereby reducing carrier mobility and velocity.

Figure 1:
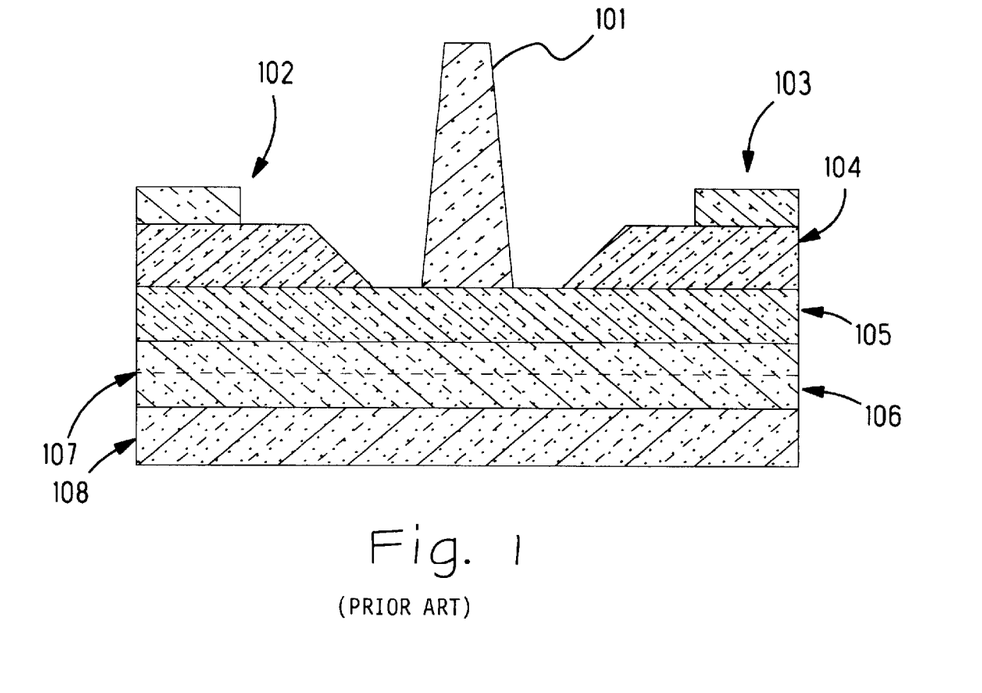
FIG. 1 is a cross-sectional view of a conventional PHEMT structure.

The desirable performance advantages of the PHEMT structure by virtue of the high mobility of the carriers of the two dimensional electron gas which is disposed in the InGaAs epitaxial layer results in a higher electron saturation velocity compared to conventional MESFET structures. Because the high mobility two dimensional electron gas is disposed deep in the epitaxial layer structure, relatively complicated techniques have to be employed in order to be able to modulate the 2DEG layer with a gate. A conventional PHEMT structure is as shown in FIG. 1. The structure shown in FIG. 1 has a gate 101 a source 102 and a drain 103. The $n^+$GaAs layer 104 is highly doped to effect the Ohmic contact at the drain and source. The AlGaAs layer 105 and the InGaAs layer 106 form the required heterojunction to form the PHEMT structure. The substrate is shown at 108, and the 2DEG conduction layer is shown at 107. The gate recess etch is a very important step in the fabrication of all GaAs base field effect transistors. This step determines all the critical DC parameters of the device, whether the device is a PHEMT or a MESFET.

Figure 2:
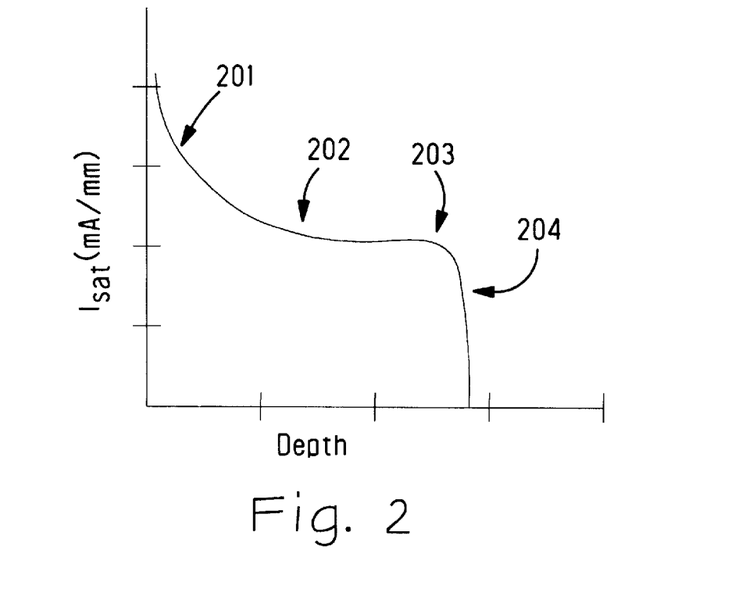
FIG. 2 is a graphical representation of the saturation current versus etch depth.

Conventional techniques for fabricating the recess require an iterative etching process. As can be readily appreciated, it is necessary to reduce the distance between the gate and the 2DEG layer to an optimum point in order to effectively modulate the 2DEG layer in operation by way of the depletion layer formed under the gate. As stated above, a double recess structure is often utilized in the PHEMT. An iterative fabrication process requires etching down through the GaAs and AlGaAs layers while sampling the current periodically. As the etching process proceeds, carriers are removed as selective regions of each layer are removed. As can be seen in FIG. 2, which is a graph showing the current versus the depth of the etch, a large decrease in saturation current per unit of depth occurs in the first region 201 which is $n^+$GaAs. The region 202 shows a reduction in the slope of the saturation current relative to the depth, as the number of carriers in the lower doped AlGaAs layer is etched. Finally, the optimal point of etch depth is shown at 203. Beyond this point, a large number of carriers would be removed from the 2DEG layer and is shown FIG. 2 at 204. Accordingly, it is necessary to etch down far enough to be able to effectively modulate the 2DEG layer but not too far as the benefits of the layer are reduced as the etched surface becomes too close. Accordingly, the optimal point is at the knee of the curve shown at 203.

As stated, the double etch is required in order to increase the breakdown voltage of the PHEMT. Standard photolithographic techniques are used to effect both the first etch recess and the second etch recess. Further details of the iterative etching process done conventionally can be found in *Effects of Material Variations on the Gate Recess Behavior of Pseudomorphic HEMTs*, by Danzilio et, 1994 US Conference on GaAs Manufacturing Technology Digest of Papers, p. 53, the disclosure of which is specifically incorporated herein by reference.

Another important consideration is the effect of material variations. As stated in the reference to Danzilio, et al., variations of the vendor molecular beam epitaxy(MBE) can result in inconsistent epitaxial growth which appreciatively alters the characteristics of the PHEMT. Accordingly, while the etch depth for one wafer might be a certain value, this is not necessarily the appropriate depth in another wafer. Accordingly, rather than being at the proper point 203 of the curve shown in FIG. 2, it is possible to stop etching prior to reaching this point (for example in the region of 202) or to etch too far and end up in the region 204. Material variations play an extremely important role in the double recess etch of the PHEMT structure. If the depth of the second recess is too shallow relative to the first recess etch, gate control can be substantially reduced. To this end, if the second etch depth is relatively shallow compared to the first, the depletion region underneath the gate when the gate is swung as far in forward bias as possible is reduced enough that conduction in the 2DEG layer is uninhibited by this depletion region. However, the regions on either side of the gate about the first etch level have depletion regions thereunder due to surface charges. These depletion regions can actually impede carrier flow in the 2DEG layer, and result in a limit in the open channel current.

One technique to overcome the disadvantages of the interative process has been through the use of etch-stop layers. Single or double etch-stops can be used to properly control the depth of the etches so that both the depth of the second etches as well as the relative depth of first and second etches of the double recess structure are optimized to overcome the enumerated problems of the double recess structure and the iterative etching process to achieve PHEMT fabrication. Prior techniques include the use of AlAs, which enables the selective etching process to be carried out and the appropriate depth to be reached, but adversely impacts the access resistances. As is discussed in copending applications U.S. patent applications Ser. Nos. (09/121,144 and 09/121,160) entitled "$In_xGa_{1-x}P$ Stop Etch Layer For Selective Recess Of GaAs Based Epitaxial Field Effect Transistors" And "A Process For Selective Recess Etching Of Epitaxial Field Effect Transistors With A Novel Etch-Stop Layer", respectivley, to Hanson, the use of AlAs as the etch-stop layer is undesirable by virtue of the increase in access resistances and the reduction therefore in efficiency of the device. The disclosure of the above captioned patent applications to Hanson are specifically incorporated herein by reference.

Accordingly, what is needed is a PHEMT structure which has the benefits of the double recess with precision in both the overall etched depth as well as in the relative etch depth of the first and second recesses without the deleterious effects of prior art etch stops.

SUMMARY OF THE INVENTION

The present invention relates to a double etch recess structure for Pseudomorphic High Electron Mobility Transistor (PHEMT) structures. A first embodiment makes use of single etch stop layer which precisely controls the etch depth of the second recess in order to properly locate the gate electrode relative to the 2DEG channel in a manner which eliminates the possibility of etching too close to the 2DEG channel. The etch-stop layer is a layer of $In_xGa_{1-x}P$ which enables selective etching down to the etch-stop layer, but does not have any appreciable effect on the access resistance of the device.

A second embodiment of the invention is a double recess structure in which two etch-stop layers are utilized in order to locate both the ultimate depth of the second recess as well as the relative depth of the first recess to the second recess. Again, the critical depth differential between the first and second recesses is extremely important, and the iterative process used in non etch-stop or single etch-stop processing can be eliminated. Additionally, the precision of the etch depth, in particular the relative etch depth of the first recess to the second recess is precisely controlled. Again, a layer of $In_xGa_{1-x}P$ is used for both etch-stop layers, and has no impact on access resistance.

The PHEMT devices of the present disclosure are envisioned for use in power applications with improved efficiency when compared to other structures, resulting in lower DC power consumption. Furthermore, the PHEMT of the present disclosure is also envisioned for use in high frequency applications. The improved power and gain enables operation in the range of 20–40 GHz in communications systems.

DETAILED DESCRIPTION OF THE INVENTION

Figure 3:
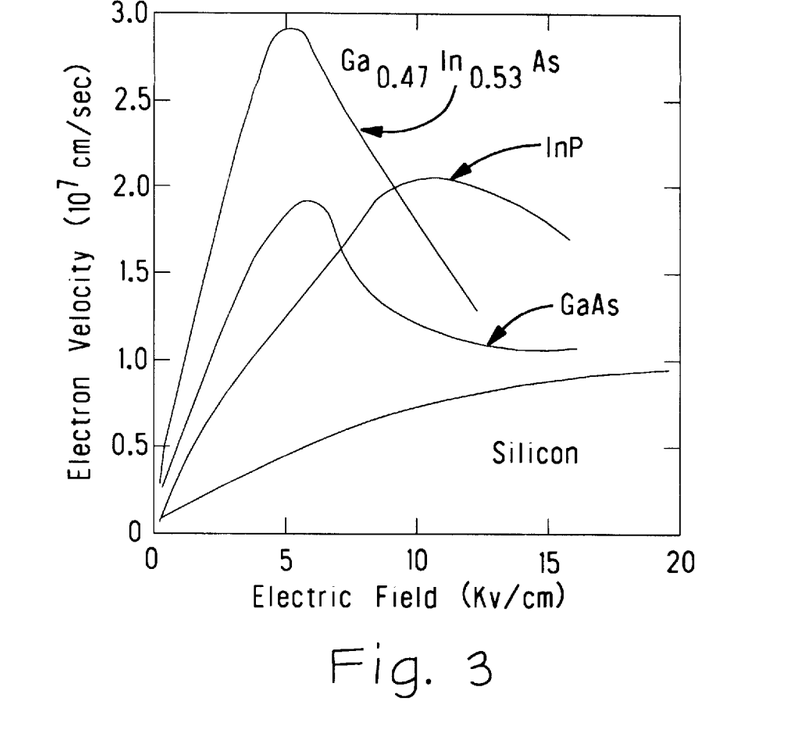
FIG. 3 is a graphical representation of electron velocity versus electric field intensity for selected semiconductor materials.

Pseudomorphic High Electron Mobility Transistors make use of an InGaAs as the narrow band gap semiconductor of the heterojunction. InGaAs has a higher peak electron velocity than GaAs and for this reason has performance advantages when compared to conventional HEMT structures. FIG. 3 shows the relative electron velocity versus electric field intensity. As stated, in the preferred embodiment of the invention of the present disclosure, the InGaAs is stoichiometrically $Ga_xIn_{1-x}As$ with 0.1<x<0.25. The preferred structure of the first embodiment of the invention of the present disclosure is as follows. This structure is also basically employed in the second embodiment disclosed herein with the differences related to the second etch stop layer being as discussed below. Furthermore, in either the first or second embodiment, alternative materials and alternative stoichiometries can be used. Clearly, those disclosed are merely exemplary and alternatives within the purview of the skilled artisan are possible.

Figure 4:
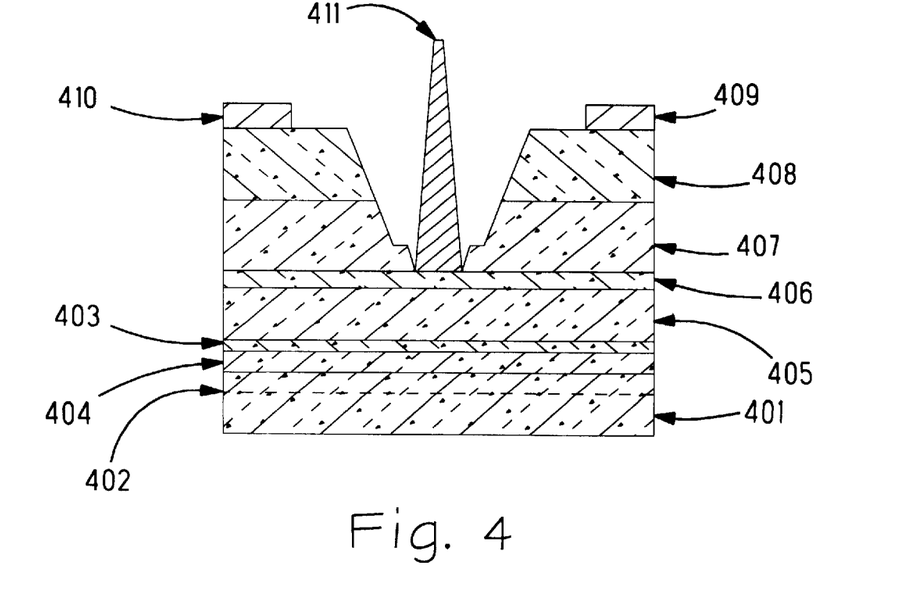
FIGS. 4–12 are cross-sectional views during various stages of fabrication of the PHEMT of the invention of the present disclosure using the single and double etch stops. The final structures of the PHEMT fabricated using a single and double etch stop layers are shown in FIGS. 4 and 12, respectively.

A GaAs substrate has a buffer layer of GaAs disposed thereon. AlGaAs/aAs superlattice layer is disposed on the buffer layer. These three preceding layers have not been shown in FIG. 4 for sake of clarity of discussion. The basic structure of the substrate, buffer and superlattice in a PHEMT is well known to one of ordinary skill in the art. The channel layer of InGaAs is shown at 401. The 2DEG layer is disposed therein as shown at 402 and is formed through the quantum mechanical tunneling of electrons from a plane of silicon atoms shown at 403 through the AlGaAs spacer layer at 404 and into the quantum well. A layer of preferably AlGaAs (although GaAs can form the Schottky layer) is disposed on top of the layer of silicon atoms as shown at 405. This layer forms the Schottky barrier of the device and is nominally n-doped to improve device access resistance. An etch-stop layer of $In_xGa_{1-x}P$ is disposed on top of the AlGaAs layer as shown at 406 thereafter a layer of n-GaAs is disposed as shown as 407. This n-GaAs layer acts as a transition layer between the AlGaAs Schottky layer 406 and the upper most $n^+$ doped GaAs layer 408. The layer of GaAs 408 is doped $n^+$ to facilitate the forming of ohmic contacts at the source and drain shown at 409 and 410, respectively. The gate contact is shown at 411.

Figure 5:
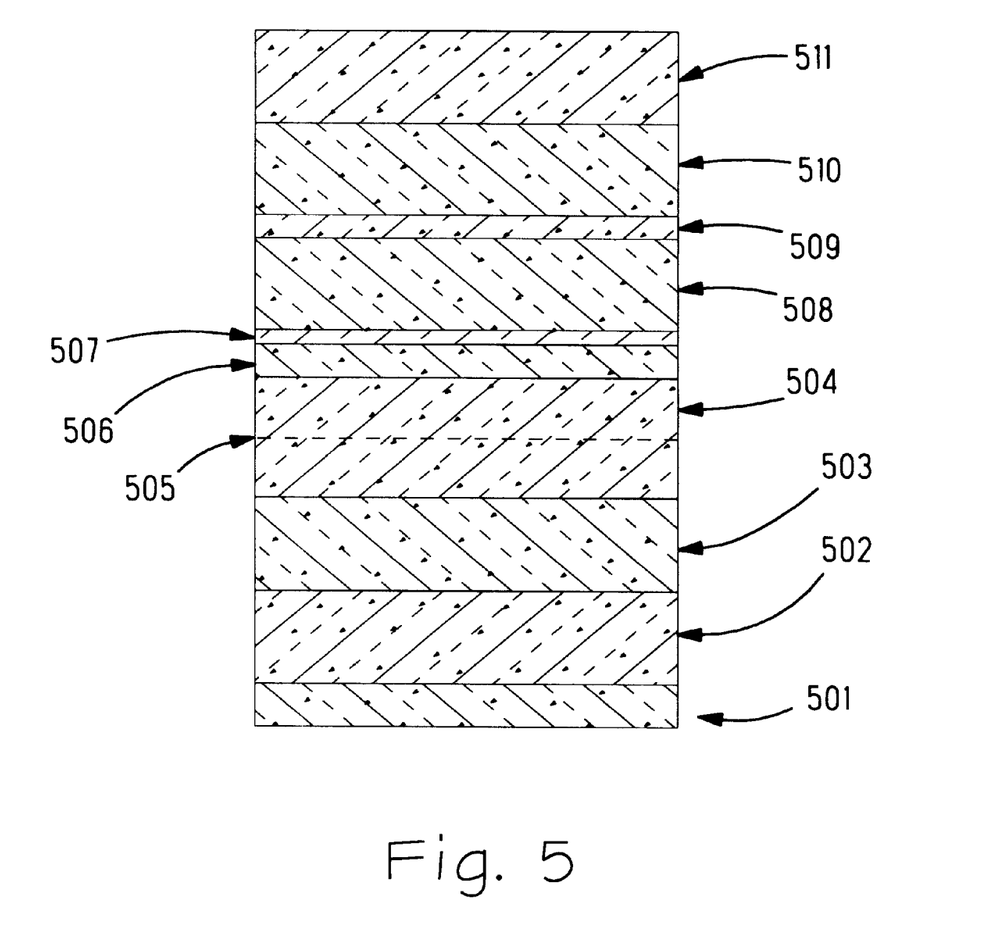

Turning to FIG. 5, the process steps for fabricating the double recess PHEMT structure by using a single etch-stop layer is disclosed. Again, the preferred materials, stoichiometries and techniques for carrying out the invention are disclosed, it is clear that variations in materials, stoichiometries and alternative processing techniques are possible as would be apparent to one of ordinary skill in the art. The GaAs substrate 501 has disposed thereon a layer of unintentionally doped GaAs 502 and forms the buffer layer. Disposed on top of the buffer layer is the AlGaAs/GaAs superlattice layer, shown at 503. The channel layer of InGaAs is shown at 504. Again this layer is $Ga_xIn_{1-x}As$ with $0.1<x<0.25$, having a thickness on the order of 70 to 150 Å. This layer is undoped for reasons discussed above. Thereafter, a hyperabrupt heterojunction is formed by Molecular Beam Epitaxy (MBE) of AlGaAs (or GaAs) 506, which is $n^-$ and is disposed on top of the layer 504 of undoped InGaAs. This layer 506 serves as the Schottky layer of the device. MBE is used to form the hyperabrupt heterojunction between the $Al_xGa_{1-x}As$ (with $0.2<x<0.25$) and $In_xGa_{1-x}As$ (with $0.15<x<0.25$) such that the transition between the two materials is on the order of one atomic diameter. A plane of silicon atoms, which supplies electrons to form the 2DEG layer 505, is formed by MBE as shown at 507 and is disposed above layer 506. Following this epitaxial growth step, a layer of n-doped AlGaAs is disposed by MBE at 508. Continuing, a first etch-stop layer of $In_xGa_{1-x}P$ is disposed by MBE as shown at 509. This layer of $In_xGa_{1-x}P$ is preferably stoichiometrically effected where x lies in the range of 0.4 to 0.6. Thereafter a layer 510 of lightly doped GaAs (or AlGaAs) is grown by MBE on top of the etch-stop layer. Finally, a layer of $n^+$ doped GaAs is grown by MBE on top of the layer of GaAs and forms the layer necessary to form a good ohmic contact to the drain and source metallization and is shown at 511. While MBE is the preferred technique (because of its ability to form an abrupt junction between layers) for the formation of the above recited layer structure, it is of interest to note that less preferably metal organic chemical vapor deposition (MOCVD) can be used.

Figure 6:
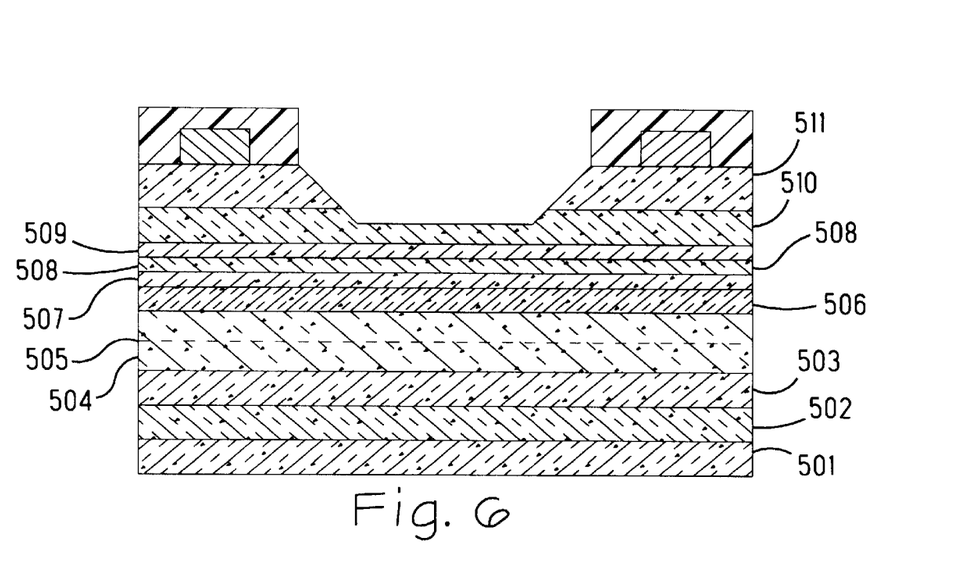
Figure 7:
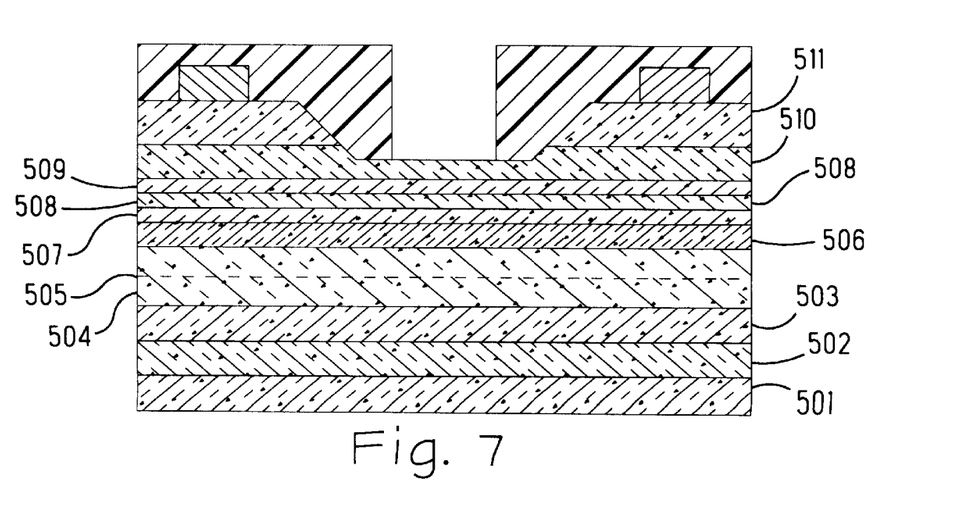

As discussed previously, in the first embodiment, an iterative process can be used to form the first recess of the double recess PHEMT structure. (The layer structure is the same as shown in FIG. 5). This iterative process involves patterning the first recess using standard photolithographic techniques followed by etching the gate recess (FIG. 6) and taking current measurements until a predetermined target value of ungated saturation current is reached. As stated in conjunction with FIG. 2, it is necessary to reach a current value indicated in FIG. 2 as the region between 202 and 203 as shown when the first recess etching is completed. Therefore, the first etch is effected down into the layer of AlGaAs to a point which approaches the point 203 of optimal etch step for the double recess. Thereafter, a second photolithographic step is effected (FIG. 7) and the exposed central portion of the first recess is etched down to the layer of $In_xGa_{1-x}P$ (509) which forms the etch-stop layer. To this end, as is described in the above referenced patent applications to Hanson, the selective chemistry will not etch through the $In_xGa_{1-x}P$. The preferred selective recess etch chemistry used is a mixture of sulfuric acid, hydrogen peroxide and deionized water in a ratio of 1:8:500 respectively. However, as would be understood by one of ordinary skill in the art, other etch chemistries consistent with the objectives above can be used.

After completion of the second recess, a metal deposition is performed to form the gate electrode. After deposition, the patterned photoresist and extraneous metal are removed in a well-known process referred to as liftoff, and the final features of the double recess PHEMT are realized. As stated above, it is important to have the depth of the etch of the second recess at a precise point so that the gate can properly modulate the channel but not too close to the channel so that the depletion layer under the gate does not interfere with the ability to fully open the channel during forward bias conditions. The optimum distance from the recess surfaces to the heterointerface is dependent upon the particulars of the PHEMT layer structure in use but typically is between 100 and 300 angstroms for the second recess and 300 to 500 Angstroms for the first recess.

Figure 8:
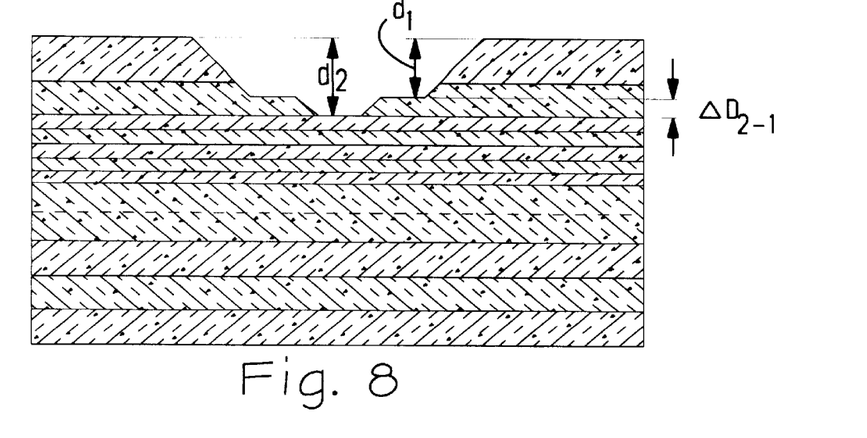

A second embodiment of the invention of the present disclosure makes use of two etch-stop layers of $In_xGa_{1-x}P$. The etch-stop stoichiometry is the same as described in connection with the one etch-stop layer above, and the etch chemistry is the same as well. As discussed previously, it is important that the difference between the depth of the first recess and the depth of the second recess, commonly referred to as $\Delta D_{2-1}$ as shown in FIG. 8, be greater than or equal to some critical value. As stated previously, the surface charges disposed on the surface of the first etch form a natural depletion region about the surface of the first etch into the layer of AlGaAs. If the difference between the depths shown as $\Delta D_{2-1}$ of FIG. 8 is less than on the order of 100 Angstroms, the depletion layers created by the surface carriers at the first etch recess can effectively dominate the depletion region about the gate. To this end, the depletion region around the first recess depth formed by the surface carriers can extend too close to the 2DEG channel and when the device is in full forward bias, the channel is interfered with by the depletion regions formed by these surface charges. This can limit the channel current as discussed previously. This deleterious affect can degrade power performance and eliminate the ability to properly operate at high frequency. Accordingly it is necessary to control with precision the difference between the first recess depth etch and the second recess depth etch and assure that this does not fall below a minimum differential of on the order of 100 angstroms or less. While the iterative process discussed in connection with the first embodiment is a useful tool in determining with accuracy the overall etch depth of the double recess by placing the etch stop layer at a point where the second recess terminates, it is preferable to control the difference between the depths of the first recess and the second recess in a manner which eliminates the uncertainty of iterative processing and material variation.

Figure 10:
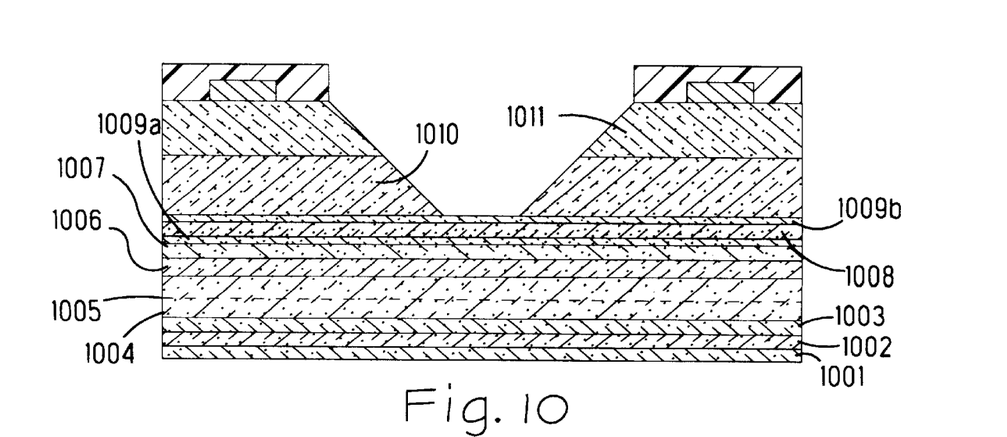

The second embodiment of the invention of the present disclosure uses two etch-stop layers to eliminate this uncertainty. The first etch-stop layer is formed in the layer of AlGaAs at a depth where is it desirable to stop the first recess. The second etch-stop layer is disposed to properly locate the depth of the second recess. By the accuracy of epitaxial growth techniques, it is possible to locate the first and second etch-stop layers to effect the desired depth of the double recess as well as the relative depth of the first recess to the second recess. It is of interest to note that the first recess is always substantially deeper than the second recess. Again, the typical etch depths for both recesses are determined by the particular PHEMT material structure in use, however, for the layer structures described above, the first recess depth is typically in the range of 200 to 750 angstroms and the second recess is typically 100 to 250 angstroms deep. Even for a given material structure, variations in the MBE growth resulting in a higher than desired electron concentration in the 2DEG layer will cause the first recess etch depth to increase in order to reach the predetermined current target. This effectively places the first recess closer to point 203 in FIG. 2. Furthermore when the second recess etch begins, the current value prior to etching is very close to or at the optimal point indicated by 203 of FIG. 2. This results in a second recess etch depth less than the critical value of approximately 100 angstroms necessary to obtain adequate power performance. The mechanism for this performance degradation was described earlier in this disclosure. Layers of the substrate, 1001 buffer 1002 and AlGaAs/GaAs superlattice 1003 are also employed in the structure having the double etch-stop. The channel layer of InGaAs 1004, with the 2DEG layer 1005 are prefered layers and are the same as is discussed above in connection with the single etch stop structure of the double recess PHEMT. The AlGaAs (or GaAs) Schottky layer (1006) and the Si layer (1007) for electron supply to the 2DEG layer are as discussed in connection with the first embodiment. The n-doped AlGaAs (1008), the etch stop layers (1009a and 1009b), the GaAs or AlGaAs layer (1010) and the contact layers (1011) are also the same as was discussed in connection with the single etch-stop double recess PHEMT structure of the first embodiment. The clear difference between the processing required for the double etch-stop double recess PHEMT structure of the present embodiment relative to the first embodiment where only one etch-stop layer is disposed is in the epitaxial growth of a second etch-stop layer. To this end, the second etch-stop layer is disposed on the AlGaAs layer at a predetermined distance from the first etch stop layer towards the surface of the epitaxial layer structure.

Figure 9:
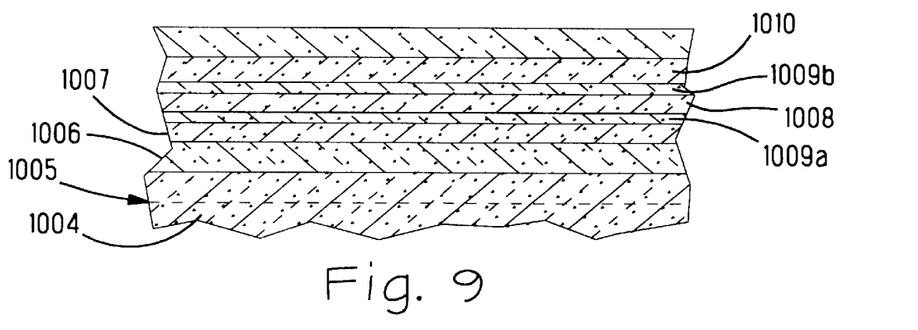

The same epitaxial layer structure used for the first embodiment (where only one etch-stop layer is used) is grown by MBE with the first $In_xGa_{1-x}P$ (1009a) layer having a thickness of 20 to 50 Angstroms. Thereafter a layer of lightly doped n-type AlGaAs (or GaAs) is grown to a thickness of 100 to 250 angstroms. A second etch stop layer of $In_xGa_{1-x}P$ having thickness of 20 to 50 angstroms is then grown. Furthermore, the remainder of the layer structure above the second etch stop layer is grown in the same manner as that used for the first embodiment where only one etch-stop layer is used and consists of a layer of lightly doped n-type GaAs followed by a layer of highly doped n$^+$ GaAs (FIG. 9). The thickness of AlGaAs or GaAs interposed between the first etch-stop and the second etch-stop layer determines the depth differential between the first recess and the second recess. As stated previously, this is on the order of 100 to 250 Angstroms. The standard photolithography and selective etching as described above is carried out. However, the chemistry chosen to etch the GaAs and AlGaAs will not etch the $In_xGa_{1-x}P$.

Figure 11:
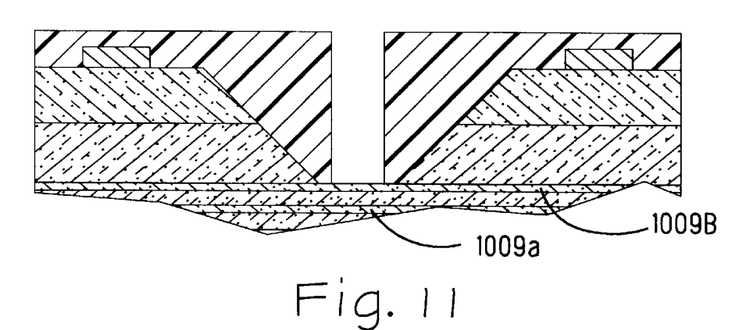
Figure 12:
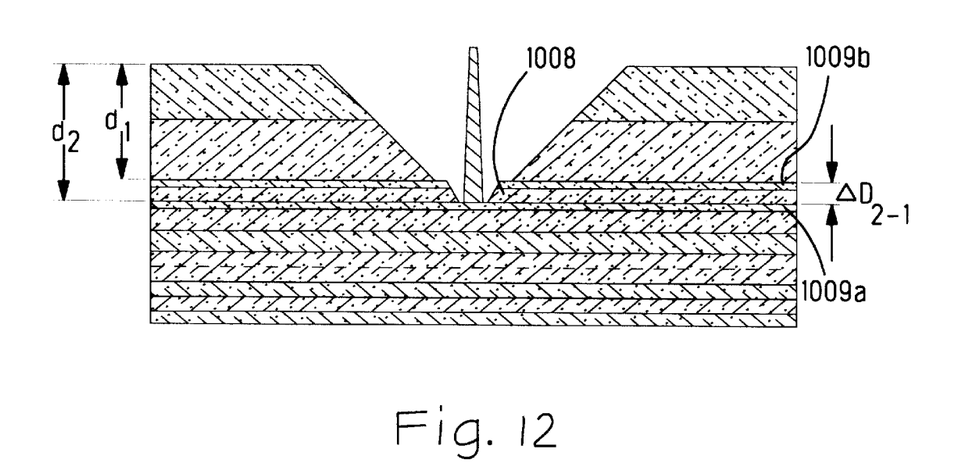

After this first photolithography/etch step is completed, the first recess is defined (FIG. 10). Thereafter, selective chemistry is used to remove the layer of $In_xGa_{1-x}P$ in the opening of the first etch so that the second etch can be effected. To this end, after the first etch is completed, a second photolithographic step is carried out to protect the areas where etching is not desired, and is shown in FIG. 11. The area of the desired opening for the second recess is left exposed, and a selective chemistry, for example HCl, is used to selectively remove the $In_xGa_{1-x}P$ layer so that the second recess can be completed. Thereafter, the etching step to finish the second recess is carried out using the same chemistry as was used in the fabrication of the first recess. The final structure, shown in FIG. 12 has the double recess which improves the breakdown voltage as is desired but does degrade the performance of the device by virtue of the selection of the proper depth between the first recess and the second recess for the reasons described above. Furthermore, the use of $In_xGa_{1-x}P$ for both etch-stop layers does not affect the access resistances as is described in the incorporated applications to Hanson.

While the discussion to this point has centered around a PHEMT structure based on a GaAs substrate, it is also possible to fabricate a PHEMT structure with a double recess by the techniques disclosed in connection with the first and second embodiments above based on InP substrate. While InP is a possible alternative, it is less preferred than a structure based on GaAs. The structure of an InP PHEMT is as follows. The InP PHEMT has an AlInAs buffer layer disposed thereon with an AlInAs/InGaAs superlattice structure disposed on the buffer layer. The channel layer is preferably $In_{0.53}Ga_{0.47}As$ although it is also possible to have a stoichiometry of $In_{0.7}Ga_{0.3}As$, with the Schottky layer being AlInAs and the contact layer being n$^+$ InGaAs.

The PHEMT layer structures described above employ a single silicon-doping plane to effect formation of the 2-DEG within the InGaAs. The formation of a 2-DEG layer in the InGaAs of a PHEMT layer structures can also be effected through the use of two silicon doping planes, one above and one below the InGaAs, with suitable AlGaAs spacer layer interposed between the InGaAs and the silicon. Similarly a 2-DEG layer can be formed through the use of doped AlGaAs in place of the silicon doping planes on one or both sides of the InGaAs. These and other variations of the PHEMT layer structure are well known to one skilled in the art. Finally the use of InGaP etch stop layers in such PHEMT layer structures is equally beneficial as is described earlier.

The invention having been described in detail, it is clear that variations and modifications of the invention of the present disclosure are within the purview of one of ordinary skill in the art having has the benefit of the present disclosure. The $In_xGa_{1-x}P$ etch-stop layers, either one layer in the first embodiment or two layers in the second embodiment are chosen to properly fabricate the double recess structure while reducing or even eliminating interative steps of the prior techniques. Furthermore, the structures of invention of the present disclosure has advantages in the proper selection of the depth of the first recess relative to the second recess. Finally in either structure of the PHEMT of the embodiments of the present disclosure, the $In_xGa_{1-x}P$ etch stop layers have been found to not increase the access resistances by any significant amount. Accordingly, the devices of the invention of the present disclosure have all the performance benefits of the PHEMT structure without increasing parasitic resistances, however have the improvements in both processing and overall structure as described above. To the extent that modifications and variations to the disclosure of the present invention are within the purview of the art of someone of ordinary skill, such are deemed within the scope of the present invention.

What is claimed is:

1. A Pseudomorphic HEMT structure, comprising: a semiconductor layer having a 2DEG layer therein; a layer of silicon atoms; a Schottky layer; a transition layer and an ohmic contact layer on said transition layer; a double recess structure disposed through said ohmic layer and into said transition layer; and an etch-stop layer of $In_xGa_{1-x}P$ defining a bottom surface of said recess.

2. A Pseudomorphic HEMT as recited in claim 1, wherein said double recess further comprises a first recess and a second recess, said first recess having a lower surface at a first depth and said second recess having said bottom surface at a second depth.

3. A Pseudomorphic HEMT as recited in claim 2, wherein said first depth and said second depth are at a prescribed distance apart, said distance being $\geq 100$ angstroms.

4. A Pseudomorphic HEMT as recited in claim 1, wherein said semiconductor layer having said 2DEG layer therein is an InGaAs channel layer.

5. A Pseudomorphic HEMT as recited in claim 1, wherein $0.4 \geq x \geq 0.6$.

6. A Pseudomorphic HEMT as recited in claim 1, wherein said transition layer is GaAs and said ohmic contact layer is AlGaAs.

7. A Pseudomorphic HEMT structure, comprising:

a substrate having a buffer layer and a super lattice layer disposed thereon; a channel layer disposed on said super lattice layer; a spacer layer disposed on said channel layer; a Schottky layer disposed on said spacer layer, a transition layer over said Schottky layer, and an ohmic contact layer disposed on said transition layer; and a double recess structure through said ohmic layer and into said transition layer, said double recess having a first recess at a first depth $d_1$, said second recess having a bottom surface at a second depth $d_2$, said bottom surface being an etch-stop layer of $In_xGa_{1-x}P$ between said Schottky layer and said transition layer.

8. A Pseudomorphic HEMT as recited in claim 7, wherein another etch-stop layer of $In_xGa_{1-x}P$ is disposed at said first depth, $d_1$.

9. A Pseudomorphic HEMT as recited in claim 7, wherein $d_2-d_1=\Delta D_{2-1} \geq 100$ angstroms.

10. A Pseudomorphic HEMT as recited in claim 7, wherein said substrate is GaAs, said buffer is GaAs, said super lattice is alternating layers of AlGaAs and GaAs, said channel layer is $In_yGa_{1-y}As$, said Schottky layer is n AlGaAs and said ohmic layer is n GaAs.

11. A Pseudomorphic HEMT as recited in claim 10, wherein $0.1 \geq y \geq 0.25$ for said channel layer.

12. A Pseudomorphic HEMT structure, comprising:

a substrate having a buffer layer disposed thereon, a super lattice layer disposed on said buffer layer, a channel layer disposed on said super lattice layer, a spacer layer, a layer of silicon atoms disposed on said spacer layer, a Schottky layer, a transition layer disposed over said Schottky layer, and an ohmic contact layer disposed on said transition layer; a double recess disposed through said ohmic layer and said transition layer, said double recess having a first recess at a first depth $d_1$, an etch-stop layer of $In_xGa_{1-x}P$ disposed at said first depth $d_1$, and said etch-stop layer having an opening therein; and said double recess having a second recess at a second depth $d_2$, said second recess having a bottom surface of a second layer of $In_xGa_{1-x}P$.

13. A Pseudomorphic HEMT as recited in claim 12, wherein $d_2-d_1 \Delta D_2 \geq 100$ angstroms.

14. A Pseudomorphic HEMT as recited in claim 12, wherein said substrate is GaAs, said buffer is GaAs, said supperlattice is AlGaAs/GaAs, said channel layer is $In_yGa_{1-y}As$, said Schottky layer is $n^-$ AlGaAs and said ohmic layer is $n^-$ GaAs.

15. A Pseudomorphic HEMT as recited in claim 13, wherein $0.4 \geq y \geq 0.6$ for said etch stop layer.

16. A Pseudomorphic HEMT as recited in claim 1 further comprising a spacer layer disposed between said semiconductor layer and said layer of silicon atoms.

17. A Pseudomorphic HEMT as recited in claim 16 wherein said spacer layer is n-doped AlGaAs.

18. A Pseudomorphic HEMT as recited in claim 7 further comprising a layer of silicon atoms disposed between said spacer layer and said Schottky layer.

19. A Pseudomorphic HEMT as recited in claim 18 wherein said spacer layer is n-doped AlGaAs.

20. A pseudormorphic HEMT as recited in claim 12 wherein said spacer layer is AlGaAs.

* * * * *